US010770466B2

(12) United States Patent
Kobayashi et al.

(10) Patent No.: US 10,770,466 B2
(45) Date of Patent: Sep. 8, 2020

(54) SEMICONDUCTOR DEVICES COMPRISING DIGIT LINE CONTACTS AND RELATED SYSTEMS

(71) Applicant: Micron Technology, Inc., Boise, ID (US)

(72) Inventors: Naoyoshi Kobayashi, Hiroshima (JP); Osamu Fujita, Hiroshima (JP); Katsumi Koge, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/258,296

(22) Filed: Jan. 25, 2019

(65) Prior Publication Data
US 2020/0243539 A1   Jul. 30, 2020

(51) Int. Cl.
*H01L 27/108*       (2006.01)

(52) U.S. Cl.
CPC .. *H01L 27/10888* (2013.01); *H01L 27/10805* (2013.01); *H01L 27/10885* (2013.01); *H01L 27/10891* (2013.01)

(58) Field of Classification Search
CPC ......... H01L 27/10888; H01L 27/10885; H01L 27/10891; H01L 27/10805
See application file for complete search history.

(56) References Cited

U.S. PATENT DOCUMENTS

| 8,936,948 | B2 | 1/2015 | Fujita |
| 9,704,871 | B2 | 7/2017 | Wu |
| 2018/0102366 | A1 | 4/2018 | Wang et al. |

*Primary Examiner* — Anthony Ho
(74) *Attorney, Agent, or Firm* — TraskBritt (57) ABSTRACT

A semiconductor device comprises laterally-neighboring word lines having respective word line caps thereon, an active region between the laterally-neighboring word lines and word line caps, an insulating material and a semiconductive material adjacent the word line caps, and a digit line contact between opposing substantially vertical surfaces of the semiconductive material, between opposing substantially vertical surfaces of the insulating material, adjacent to substantially horizontal surfaces of the word line caps, and between opposing substantially vertical surfaces of the word line caps. A transition surface extending between and connecting the substantially horizontal surface and the substantially vertical surface of the respective word line caps projects toward a longitudinal axis extending centrally through the digit line contact. Methods of forming the semiconductor device are also disclosed, as are electronic systems including the semiconductor device.

12 Claims, 6 Drawing Sheets

SEMICONDUCTOR DEVICES COMPRISING DIGIT LINE CONTACTS AND RELATED SYSTEMS

TECHNICAL FIELD

Embodiments of the disclosure relate to the field of semiconductor device design and fabrication. More specifically, embodiments disclosed herein relate to semiconductor devices including substantially unetched word line caps having substantially vertical and substantially horizontal surfaces defining at least a portion of a perimeter of a digit line contact, and to related electronic systems and methods.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of a memory cell is a dynamic random access memory (DRAM) cell. In the simplest design configuration, a DRAM cell includes one access device, such as a transistor, and one storage device, such as a capacitor. Modern applications for memory devices can utilize vast numbers of DRAM cells, arranged in an array of rows and columns. The DRAM cells are electrically accessible through digit lines and word lines arranged along the rows and columns of the array.

Figure 1:
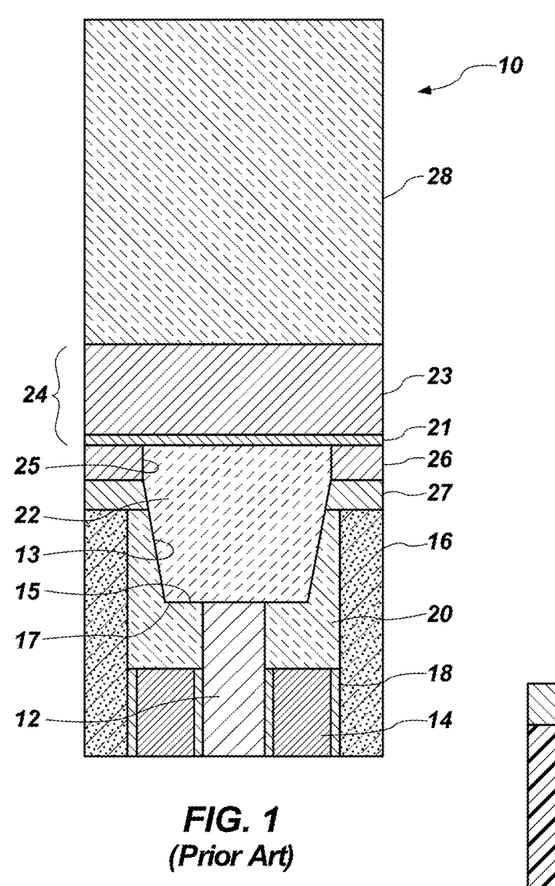
FIG. 1 is a schematic cross-sectional view of a conventional semiconductor device.

FIG. 1 illustrates a transistor 10 of a conventional DRAM cell. The transistor 10 includes an active area 12 extending between neighboring word lines 14 and shallow trench isolation (STI) regions 16 extending between neighboring active areas 12 to isolate the active areas 12 from one another. An oxide region 18 is provided about the word lines 14 between the word lines 14 and the active area 12 and the STI region 16, respectively. Each word line 14 is provided with a word line cap 20. A digit line contact 22 (e.g., digit line plug) is formed on the active area 12 in a digit line contact opening 30 (FIG. 11) defined by surfaces 25 of a conductive region 26, an oxide region 27, and laterally-neighboring word line caps 20. A digit line 24 is electrically connected to the digit line contact 22. The digit line 24 includes a polysilicon region 21 and another conductive region 23 formed adjacent longitudinally adjacent, on, over) to the oxide region 27 and another polysilicon region (e.g., the conductive region 26) that each neighbor the digit line contact 22. A digit line cap 28 is formed adjacent to the digit line 24.

As illustrated in FIG. 1 and in FIG. 11, which is discussed in further detail below, the word line caps 20 are etched during formation of the of the transistor 10 such that at least a portion of the word line caps 20 are removed. Accordingly, the respective word line caps 20 may have a recess formed therein and defined by a sloped surface 13 and a substantially horizontal surface 15. The word line caps 20 are etched such that the sloped surface 13 extends to and intersects with the substantially horizontal surface 15 at a transition surface 17 (e.g., corner) that projects into the word line cap 20 and away from a longitudinal axis 31. Accordingly, the opening 30 in which the digit line contact 22 is formed is substantially U-shaped.

A continuing goal of the semiconductor industry has been to increase the memory density (e.g., the number of memory cells per memory die) of memory devices. While a footprint of the memory devices of memory cells, including transistors, continues to be scaled down to increase the memory density, decreasing the size of one or more components of memory cells may negatively affect performance and places ever increasing demands on the methods used to form the memory device features. For example, one of the limiting factors in the continued shrinking of memory devices is the resistance of the contacts associated therewith. For example, in a DRAM device exhibiting a dual bit memory cell structure, the digit line contact 22 is provided between the digit line 24 and an access device (e.g., a transistor) formed in or above a substrate, and storage node contacts are formed between the access device and a storage node (e.g., a capacitor) where electrical charge may be stored. As the dimensions of memory device (e.g., DRAM device) features decrease, the distance between neighboring digit line contacts of the memory arrays decreases, increasing coupling capacitances between the adjacent (e.g., laterally-neighboring) digit line contacts. With greater amounts of coupling capacitances between the adjacent digit line contacts, current and voltage pulses used to select memory cells can, undesirably, be distributed to neighboring memory cells in a memory array and thus reduce the reliability of the neighboring memory cells and the memory array as a whole.

DETAILED DESCRIPTION

The illustrations included herewith are not meant to be actual views of any particular systems or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete description of a process flow for fabricating a semiconductor device. The structures described below do not form complete semiconductor devices, or systems for processing semiconductor devices. Only those process acts and structures necessary to understand the embodiments described herein are described in detail below. Additional acts to form a complete semiconductor device or a system for processing a semiconductor device may be performed by conventional techniques.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, even at least 99.9% met, or even 100.0% met.

As used herein, the term "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, any relational term, such as "first," "second," "over," "above," "below," "up," "down," "upward," "downward," "top," "bottom," "top-most," "bottom-most," and the like, is used for clarity and convenience in understanding the disclosure and accompanying drawings and does not connote or depend on any specific preference, orientation, or order, except where the context clearly indicates otherwise.

As used herein, the term "configured" refers to a size, shape, material composition, orientation, and arrangement of one or more of at least one structure and at least one apparatus facilitating operation of one or more of the structure and the apparatus in a pre-determined way.

As used herein, a "contact" refers to a connection facilitating a conductive pathway between at least two features.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically-neighboring" or "longitudinally-neighboring" features (e.g., structures, devices) means and includes features located vertically proximate to one another. The features may directly contact one another or may be separated from one another by one or more additional features. In addition, as used herein, "horizontally-neighboring" or "laterally-neighboring" features (e.g., structures, devices) means and includes features located horizontally proximate to one another.

The methods and structures of the disclosure may facilitate increased feature density, providing enhanced performance in semiconductor devices structures (e.g., DRAM device structures, such as DRAM cells) and semiconductor devices (e.g., DRAM devices) that rely on high feature density by decreasing digit line capacitance.

Figure 2:
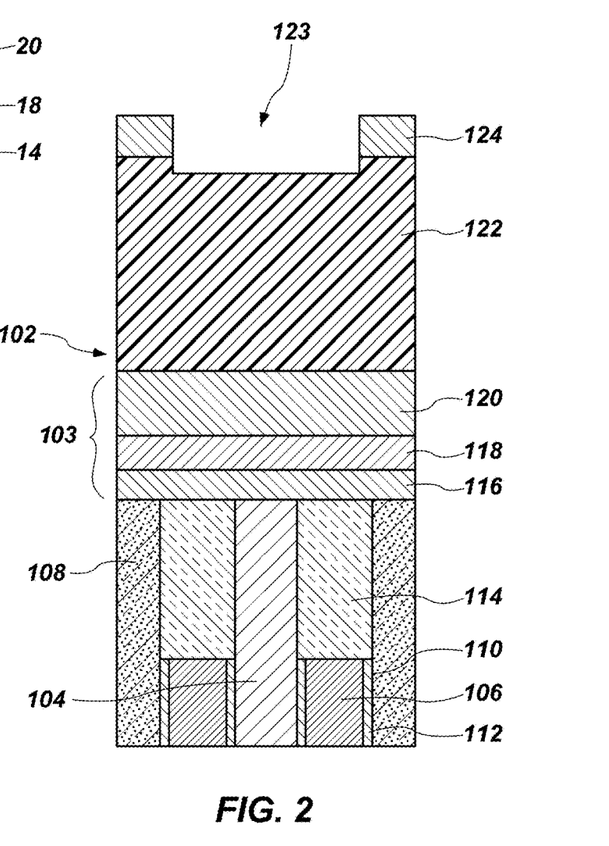
FIGS. 2 through 10 are schematic cross-sectional views illustrating a method of forming a semiconductor device, in accordance with embodiments of the disclosure.
Figure 9:
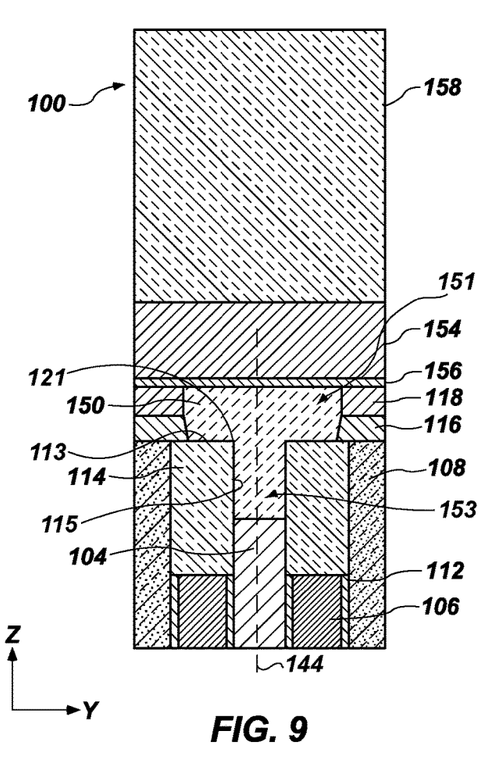
Figure 10:
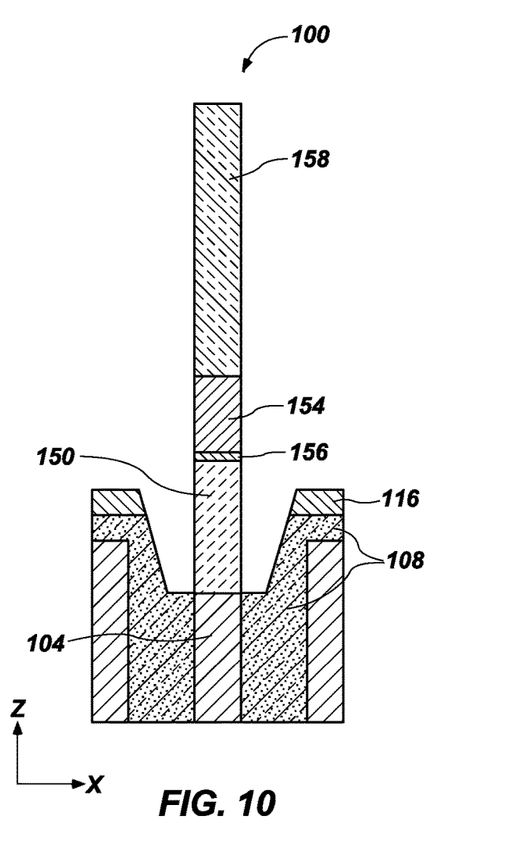

FIGS. 2 through 9 illustrate various stages of a fabrication process to form a semiconductor device 100 shown in FIGS. 9 and 10, according to embodiments of the disclosure. Referring to FIG. 2, a structure 102 may be formed on a substrate (not shown) to include an active region 104 (e.g., digit line contact region) extending between laterally-neighboring word lines 106 and between STI regions 108 that separate and isolate laterally-neighboring active regions 104. The word lines 106 may be formed in a word line trench 110 having a gate dielectric material 112 disposed on substantially vertical surfaces thereof. Each word line 106 may have a respective word line cap 114 formed adjacent an upper, substantially horizontal surface thereof within the word line trench 110. The structure 102 further includes a stack 103 of at least one stack material. The stack material may comprise at least one insulating material and at least one semiconductive material. The stack 103 may be formed adjacent to respective upper, horizontal surfaces of the STI regions 108, the word line caps 114, and the active region 104. In some embodiments, the stack 103 comprises a first insulating material 116 (e.g., electrically insulating material, dielectric), a semiconductive material 118 adjacent (e.g., longitudinally-neighboring, on, over) the first insulating material 116, and a second insulating material 120 adjacent the semiconductive material 118. A first hard mask material 122 may be formed adjacent the second insulating material 120, and a second hard mask material 124 may be formed adjacent the first hard mask material 122.

The active region 104 may be formed of and include a semiconductive material. The semiconductive material may include, but not limited to, at least one of a silicon material, a silicon-germanium material, a germanium material, a gallium arsenide material, a gallium nitride material, an indium phosphide material, or a combination thereof. In some embodiments, the active region 104 is formed of and includes a silicon material, or a material that includes elemental silicon or a compound of silicon. In such embodiments, the active region 104 comprises a monocrystalline silicon.

The STI region 108 may be formed of and include an insulating material. The insulating material of the STI region 108 may include, but is not limited to, an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), amorphous carbon, or a combination thereof. In some embodiments, the STI region 108 is a silicon oxide (e.g., silicon dioxide).

The word lines 106 may each be formed of and include a conductive material. The conductive material of the word lines 106 may include, but is not limited to, a metal (e.g., tungsten, titanium, nickel, platinum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, each of the word lines 106 may comprise at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide (IrOx), elemental ruthenium (Ru), ruthenium oxide (RuOx), alloys thereof, or combinations thereof.

The gate dielectric material 112 may be formed of and include a dielectric oxide material (e.g., silicon dioxide; phosphosilicate glass; borosilicate glass; borophosphosilicate glass; fluorosilicate glass; aluminum oxide; high-k oxides, such as hafnium oxide ($HfO_x$); a combination thereof), a dielectric nitride material (e.g., silicon nitride (SiN)), a dielectric oxynitride material (e.g., silicon oxynitride (SiON)), a dielectric carbonitride material (e.g., silicon carbonitride (SiCN)), and a dielectric carboxynitride material (e.g., silicon carboxynitride (SiOCN)), and amorphous carbon. In some embodiments, the gate dielectric material 112 comprises silicon dioxide ($SiO_2$).

The word line caps 114 may be formed of and include an insulating material. In some embodiments, the word line caps 114 comprise silicon nitride (e.g., $Si_3N_4$). The first insulating material 116 and the second insulating material 120 may be formed of and include a silicon dioxide ($SiO_2$). In some embodiments, the semiconductive material 118 is an undoped polysilicon material. In such embodiments, the semiconductive material 118 comprises a polysilicon material substantially free of impurities and may be configured to serve as an insulating material. The first hard mask material 122 may be formed of and include an amorphous carbon material. The second hard mask material 124 may comprise a dielectric anti-reflective coating (DARC).

The structure 102 including the active region 104, word lines 106, STI regions 108, gate dielectric material 112, word line caps 114, the first insulating material 116, the semiconductive material 118, the second insulating material 120, the first hard mask material 122, and the second hard mask material 124 may be previously formed by conventional techniques using one or more formation acts including, but not limited to, in situ growth processes, physical vapor deposition, chemical vapor deposition, atomic layer deposition, or a combination thereof, and one or more patterning (e.g., material removal) steps including, but not limited to, masking, etching, planarizing, or a combination thereof.

With continued reference to FIG. 2, the second hard mask material 124 may have at least one opening 123 previously patterned therein to form an opening 125 (FIG. 3) through the first hard mask material 122 and the second insulating material 120. The opening 125 may be formed by subjecting the first hard mask material 122 and the second insulating material 120 to a material removal process such as at least one etching process (e.g., at least one dry etching process, such as at least one of a reactive ion etching (RIE) process, a deep RIE process, a plasma etching process, a reactive ion beam etching process, and a chemically assisted ion beam etching process; at least one wet etching process, such as at least one of a wet chemical etching process, a buffered hydrofluoric acid etching process, and a buffered oxide etching process). In some embodiments, the opening 125 is formed by a dry etching process employing an $O_2$—$SO_2$ plasma gas to selectively remove the first hard mask material 122 and the second insulating material 120. In such embodiments, the semiconductive material 118 may serve as an etch stop material during the etching process to form the opening 125.

Figure 3:
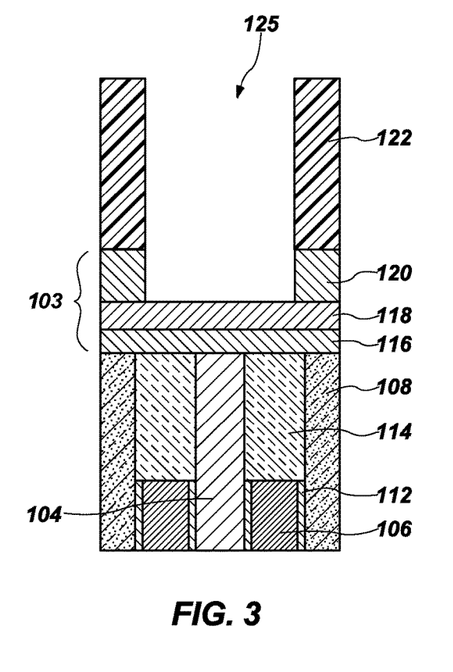
Figure 4:
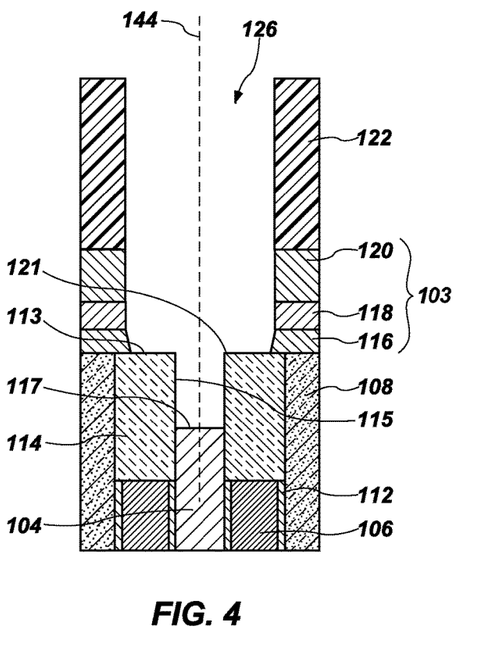

After the opening 125 is formed, the second hard mask material 124 may be removed, as illustrated in FIG. 3. With reference to FIG. 4, the opening 125 may be extended to form an opening 126 through the semiconductive material 118, through the first insulating material 116, and at least partially into the active region 104 to expose an upper, horizontal surface 117 of the active region 104. The opening 126 may be formed by selectively removing a portion of the semiconductive material 118, the first insulating material 116, and the active region 104 extending between laterally-neighboring word line caps 114. The opening 126 may be formed by subjecting at least a portion of the semiconductive material 118, the first insulating material 116, and the active region 104 extending between laterally-neighboring word line caps 114 to at least one material removal process. The material removal process includes exposing (e.g., removing material adjacent to) substantially vertical surfaces of the first hard mask material 122, substantially vertical surfaces of the semiconductive material 118, substantially vertical surfaces of the first insulating material 116, substantially horizontal surfaces 113 of the respective word line caps 114, substantially vertical surfaces of the word line caps 114, and the substantially horizontal surface 117 of the active region 104.

The material removal process may be a selective etching (e.g., selective removal) process. In some embodiments, the etching process may be an anisotropic dry etching by which a bias voltage is applied to generate a plasma gas by high-frequency excitation to cause ions in the plasma gas onto the surface of the semiconductive material 118, the first insulating material 116, the active region 104, and the word line caps 114 to selectively remove (e.g., etch) portions of the foregoing. In some embodiments, the semiconductive material 118, the first insulating material 116, and the active region 104 may be exposed to a chlorine-containing plasma gas such as a boron trichloride ($BCl_3$) plasma gas. The composition of the plasma gas, the frequency of the plasma gas excitation (e.g., power bias), etc. may be tailored such that the semiconductive material 118, the first insulating material 116, and the active region 104 are substantially removed without substantially removing (e.g., etching) or only slightly removing the word line caps 114. In some embodiments, the plasma gas composition (e.g., etchant) is selected such that the semiconductive material 118, the first insulating material 116, and the active region 104 are removed (e.g., etched) at a greater rate (e.g., etch rate) than the word line caps 114. More particularly, the plasma gas composition is selected such that the semiconductive material 118, the first insulating material 116, and the active region 104 are removed at a rate that is between about five times and about ten times greater than the rate at which the word line caps 114 are removed.

Figure 12:
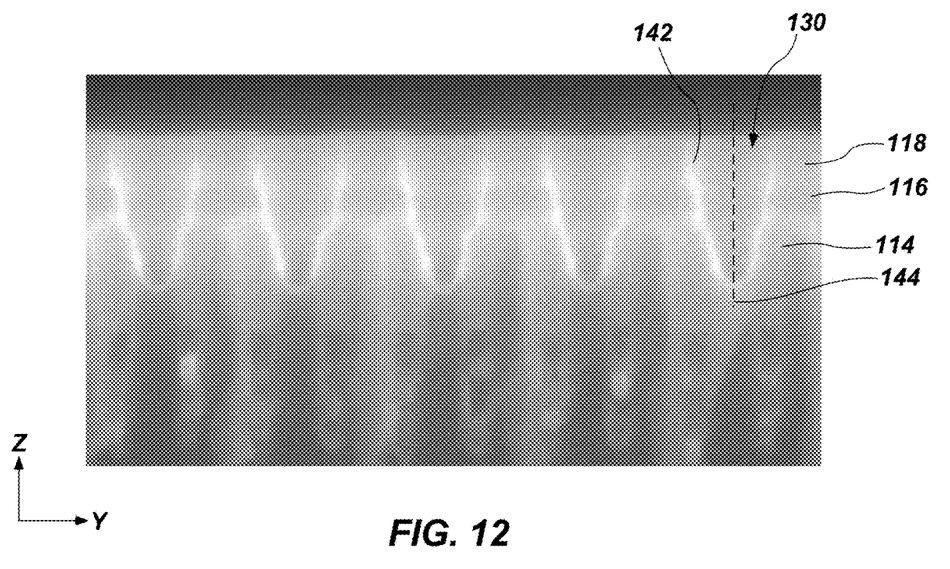

Accordingly, the semiconductive material 118, the first insulating material 116, and the active region 104 may be substantially removed without substantially removing the word line caps 114, as illustrated in FIG. 4. As the word line caps 114 are not substantially removed, the substantially horizontal surface 113 and the substantially vertical surface 115 of the respective word line caps 114 remains. Further, as the word line caps 114 are maintained (e.g., not substantially removed), a transition surface 121 (e.g., corner, intersection) extending between and connecting the substantially horizontal surface 113 and the substantially vertical surface 115 of the respective word line caps 114 projects (e.g., points, extends) toward a longitudinal axis 144 of the opening 126. The transition surface 121 may define a substantially sharp or pointed edge as illustrated in the schematic of FIG. 4. In other embodiments, the word line caps 114 may be partially etched such that the transition surface 121 of the respective word line caps 114 may be rounded or form a curved surface as illustrated in FIG. 12 and as shown by dashed lines in FIG. 6.

By way of example only, if the active region 104 is formed of monocrystalline silicon, the word lines caps 114 are formed of silicon nitride, the first insulating material 116 is formed of an oxide, and the semiconductive material 118 is formed of polysilicon, portions of the active region 104, the first insulating material 116, and the semiconductive material 118 may be selectively removed without substantially removing a portion of the word lines caps 114.

Figure 5:
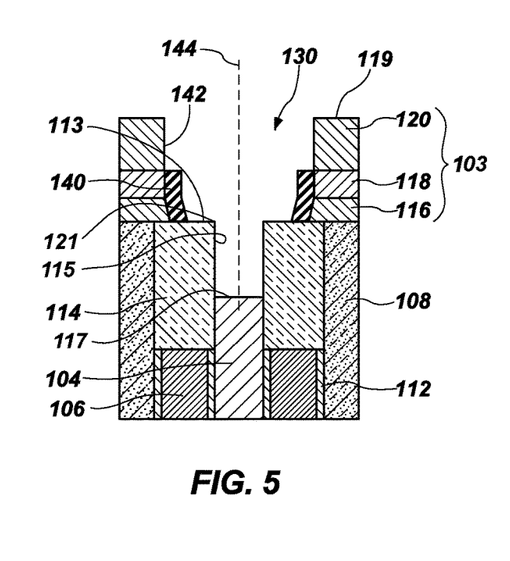

Subsequently, as illustrated in FIG. 5, the first hard mask material 122 may be removed in a material removal process to expose an upper, horizontal surface 119 of the second insulating material 120. With the first hard mask material 122 removed, an opening 130 remains extending through the second insulating material 120, through the semiconductive material 118, through the first insulating material 116, and at least partially into the semiconductive material of the active region 104 between the laterally-neighboring word line caps 114. The opening 130 may be referred to as a digit line contact (e.g., digit line plug) opening.

Surfaces 142 collectively defining the opening 130 include the opposing substantially vertical surfaces of the semiconductive material 118, the opposing substantially vertical surfaces of the first insulating material 116, the substantially horizontal surfaces 113 of the respective word line caps 114, the opposing substantially vertical surfaces 115 of the word line caps 114, a transition surface 121 extending between and connecting the substantially horizontal surface 113 and the substantially horizontal surface 117 of the word line caps 114, and the substantially horizontal surface 117 of the active region 104.

With continued reference to FIG. 5, the opening 130 may be subjected to at least one cleaning process. The cleaning process may remove silicon material or other material that may have formed adjacent to an upper, horizontal surface 117 of the active region 104 during formation of the opening 126. More particularly, the cleaning process may remove silicon material from the upper, horizontal surface 117 of the active region 104 exposed in the opening 130. The cleaning process may be a light etch process or a descum process. In some embodiments, the upper, horizontal surface 117 of the active region 104 is subjected to an ammonia ($NH_3$) forming gas or a mixture of oxygen and tetrafluoromethane ($O_2$—$CF_4$) gas to remove (e.g., etch) a portion of the silicon on or included in the active region 104.

Optionally, a barrier material 140 may be formed within the opening 130, as illustrated in FIG. 5. The barrier material 140 may be formed (e.g., deposited) along at least a portion of the vertical surfaces 142 of the opening 130. More particularly, the barrier material 140 may be formed (e.g., deposited) along a vertical surface of the semiconductive material 118. In some embodiments, the barrier material 140 may also be formed along a vertical surface of the first insulating material 116. The barrier material 140 may be selected to comprise a material that inhibits diffusion of dopants in a conductive material 146 (FIG. 6) of a digit line contact (e.g., digit line plug) 150 (FIG. 8) into the semiconductive material 118, which may be undoped polysilicon. The barrier material 140 may intervene between the substantially vertical surfaces of the semiconductive material 118 and the first insulating material 116 within the opening 130 and the digit line contact 150. In some embodiments, the barrier material 140 comprises a silicon nitride material and/or a silicon oxide material.

Figure 6:
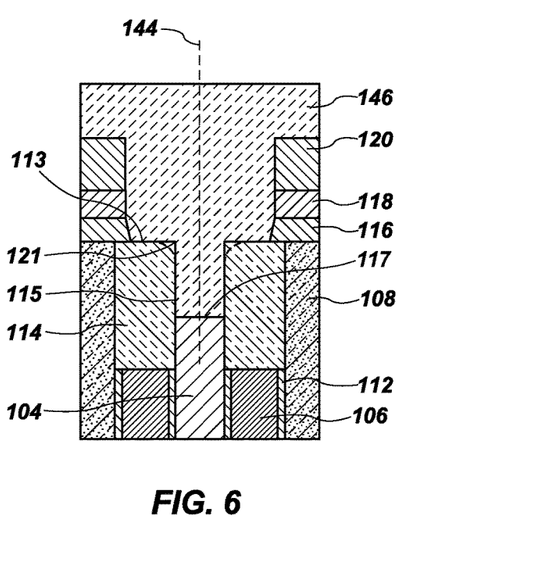

With reference to FIG. 6, a conductive material 146 may be formed (e.g., deposited) within the opening 130 such that the opening 130 is substantially filled with the conductive material 146. The conductive material 146 may also be formed to extend outside of the opening 130 such that the conductive material 146 is formed adjacent the upper, horizontal surface 119 of the second insulating material 120. As the opening 130 is defined by surfaces 142, the conductive material 146 disposed within the opening 130 may have a perimeter that is substantially complementary in shape to a shape of the opening 130 as defined by the surface 142. The conductive material 146 may be formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof. In some embodiments, the conductive material 146 comprises doped polysilicon, such as a polysilicon material having impurities.

Accordingly, a method of forming the semiconductor device comprises forming a semiconductive material extending between laterally-neighboring word lines having respective word line caps thereon, an insulating material adjacent the word line caps, and another semiconductive material adjacent the insulating material. A portion of the another semiconductive material, the insulating material, and the semiconductive material is selectively removed without substantially removing the neighboring word line caps to form an opening through the another semiconductive material, through the insulating material, and laterally between the word line caps. A conductive material is formed in the opening. In additional embodiments, a method of forming a semiconductor device comprises forming a semiconductive material extending laterally between neighboring word lines having respective word line caps thereon, a first material adjacent the word line caps, and a second material adjacent the first material. An opening is formed through the second material, through the first material, and at least partially into the semiconductive material between the respective word line caps. The opening is defined by opposing substantially vertical surfaces of the second material, opposing substantially vertical surfaces of the first material, substantially horizontal surfaces of the word line caps, opposing substantially vertical surfaces of the word line caps, and transition surfaces extending between the substantially horizontal surface and the substantially vertical surface of the respective word line caps. The transition surfaces project toward the longitudinal axis extending centrally through opening. A conductive material is formed in the opening.

Figure 7:
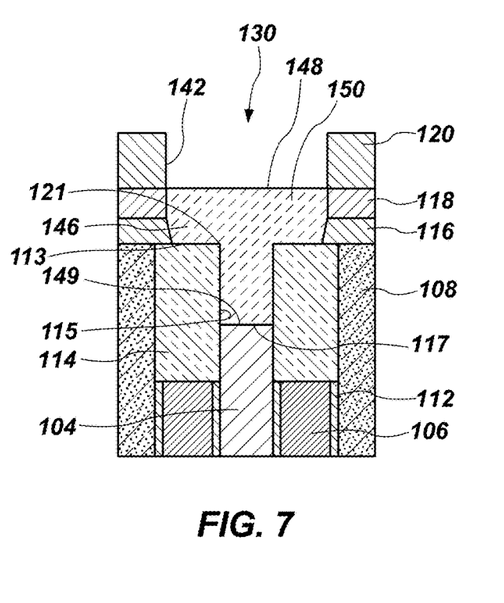

With reference to FIG. 7, the conductive material 146 may be subjected to at least one material removal process to remove a portion of the conductive material 146 extending beyond the opening 130. More particularly, the conductive material 146 extending adjacent to the upper, horizontal surface 119 of the second insulating material 120 and at least a portion of the conductive material 146 within the opening 130 adjacent to the second insulating material 120 may be removed to form a digit line contact 150. The conductive material 146 may be subjected to an etching process (e.g., an anisotropic etching process) to remove a portion of the conductive material 146. In some embodiments, the conductive material 146 is removed such that an upper, horizontal surface 148 of the digit line contact 150 is recessed relative to the upper, horizontal surface 119 (FIG. 8) of the second insulating material 120. A lower surface 149 of the digit line contact 150 is in contact (e.g., physical contact, electrical contact) with the upper, horizontal surface 117 of the active region 104. As shown in the cross-section of FIG. 7, the digit line contact 150 exhibits a T-shape, with sidewalls of a lower portion of the digit line contact 150 being substantially vertical and the transition surface 121 of the word line caps 114 exhibiting the substantially sharp or pointed edges. In contrast, sidewalls of conventional word line caps 20 and conventional digit line contact 22 are sloped.

Figure 8:
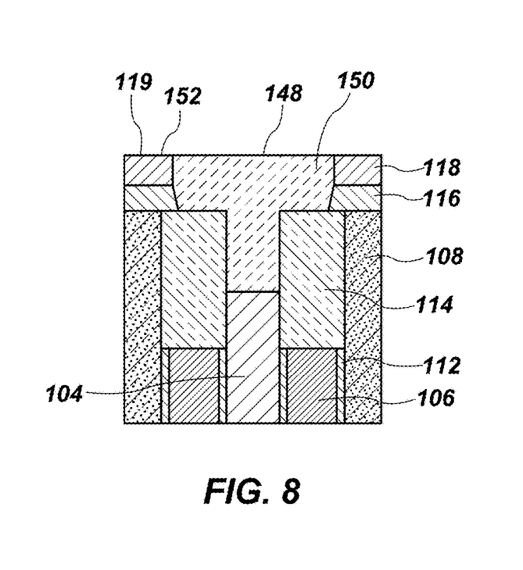

With reference to FIG. 8, the second insulating material 120 may be subjected to at least one material removal process such that an upper, horizontal surface 152 of the semiconductive material 118 is exposed. The upper, horizontal surface 152 of the semiconductive material 118 may be substantially coplanar (e.g., coextensive) with the upper, horizontal surface 148 of the digit line contact 150. With reference to FIG. 9, a barrier material 156 may be optionally formed adjacent to the upper, horizontal surface 152 of the semiconductive material 118 and adjacent to the upper, horizontal surface 148 of the digit line contact 150. The barrier material 156 may comprise a metallic material such as titanium nitride (TiN) or tungsten nitride (WN).

With reference to FIGS. 9 and 10, which are cross-sectional views of the semiconductor device 100 taken perpendicular to each other, another conductive material may be formed (e.g., deposited) adjacent to (e.g., on) the upper, horizontal surface 152 of the semiconductive material 118 to form a digit line 154. In some embodiments, the digit line 154 may be formed on an upper, horizontal surface of the barrier material 156. In other embodiments, the digit line 154 may directly contact and extend adjacent to and between laterally-neighboring digit line contacts 150 extending in a direction (e.g., the y direction of FIG. 9) substantially perpendicular to the direction (e.g., the x direction into the page of FIG. 10) of the word lines 106.

The digit line 154 may comprise a conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuOx), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

A digit line cap 158 may be formed adjacent the digit line 154. The digit line cap 158 may be formed of and include a dielectric material. In some embodiments, the digit line cap 158 comprises silicon nitride (SiN).

Accordingly, in some embodiments, the semiconductive device comprises laterally-neighboring word lines having respective word line caps thereon, an active region extending between the laterally-neighboring word lines and word line caps, a stack material adjacent the word line caps, and a digit line contact disposed between opposing substantially vertical surfaces of the stack material, adjacent to substantially horizontal surfaces of the word line caps, and between opposing substantially vertical surfaces of the word line caps. A transition surface between and connecting the substantially horizontal surface and the substantially vertical surface of the respective word line caps projects toward a longitudinal axis extending centrally through the digit line contact.

The digit line contact 150 may comprise an upper portion 151 laterally-neighboring and extending between the first insulating material 116 and the semiconductive material 118 and a lower portion 153 laterally-neighboring and extending between the word line caps 114. The upper portion 151 may be horizontally elongated and the lower portion 153 may be vertically elongated such that the upper portion 151 and the lower portion 153 are collectively substantially T-shape. As used herein, the term "horizontally elongated" refers to features (e.g., structures, devices) having a greater horizontal dimension (e.g., in the y-direction of FIG. 9) than a vertical dimension (e.g., in the z-direction of FIG. 9). As used herein, the term "vertically elongated" refers to features having a greater vertical dimension than a horizontal dimension. Put differently, the digit line contact 150 tapers (e.g., decreases) in width (e.g., a horizontal dimension) as the digit line contact 150 extends axially (e.g., in the z-direction, along the longitudinal axis 144) through the semiconductive material 118, the first insulating material 116, and the word line caps 114 between the barrier material 156 and the active region 104.

As previously discussed herein, the transition surface 121 projects (e.g., points, extends) toward the longitudinal axis 144 that extends centrally through the digit line contact 150. As the peripheral surface of the digit line contact 150 is complementary in shape to the opening 130, the peripheral surface of the digit line contact 150 is indented toward the longitudinal axis 144. The indentation results in the narrowing, or tapering, of a width of the digit line contact 150 relative to the upper portion 151 between the opposing substantially vertical surfaces 115 of the word line caps 114 to form the lower portion 153 of the T-shape.

Figure 11:
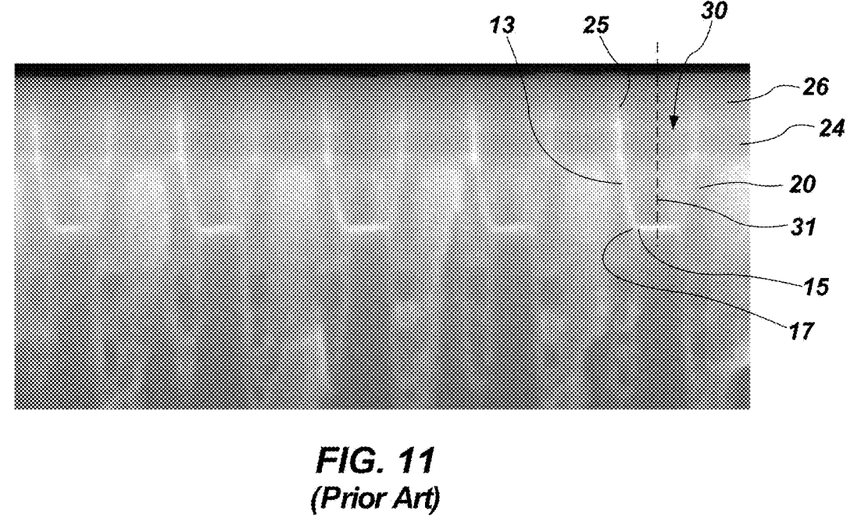
FIGS. 11 and 12 are cross-sectional micrographs of a conventional semiconductor device and the semiconductor device according to embodiments of the disclosure, respectively.
Figure 13:
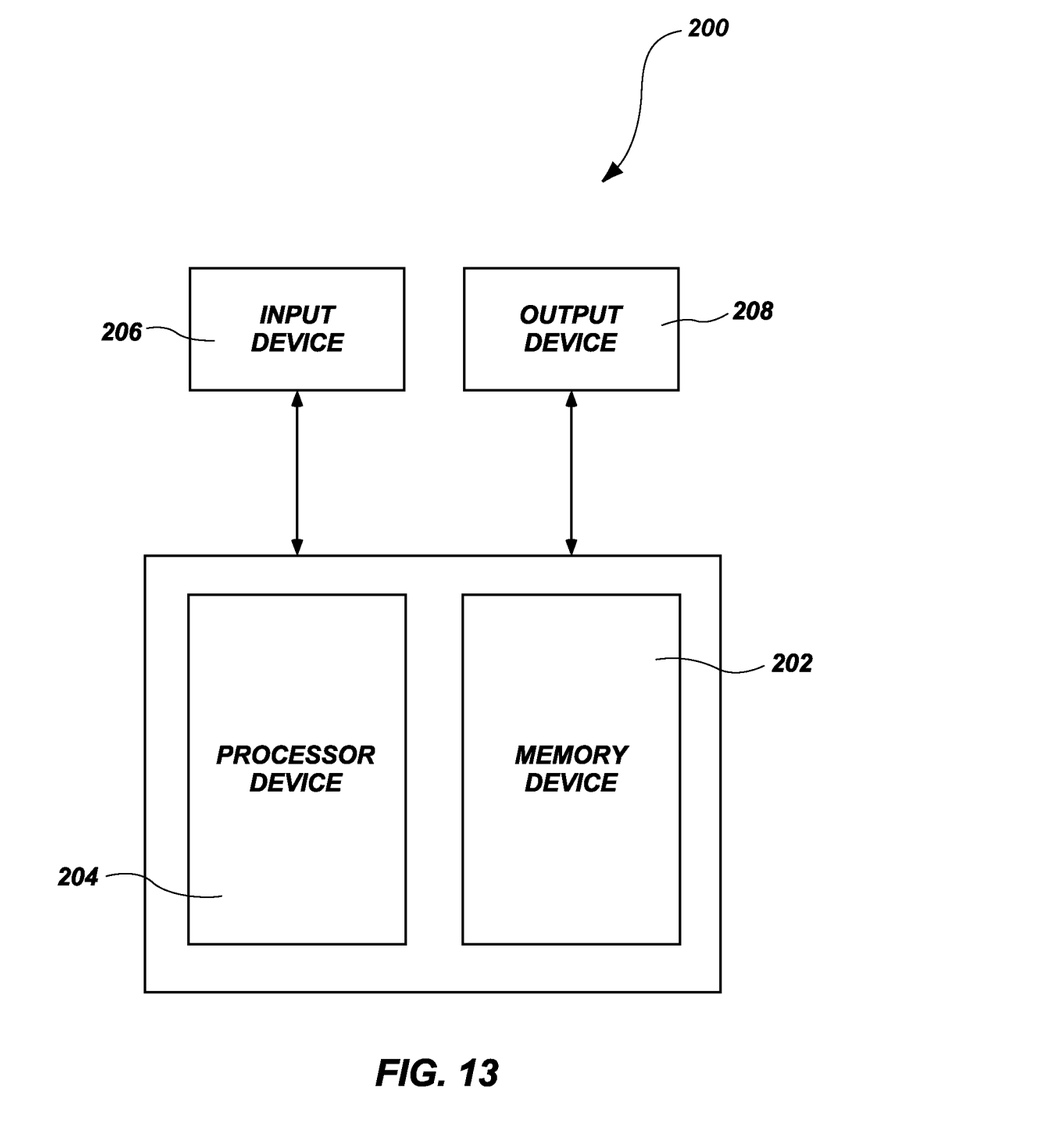
FIG. 13 is a schematic block diagram illustrating an electronic system, in accordance with embodiments of the disclosure.

A comparison of the shape of the digit line contact opening 30 of the transistor 10 of the conventional DRAM cell and the opening 130 of the semiconductor device 100 is provided by FIGS. 11 and 12, respectively. As illustrated in FIG. 11, material of the word line caps 20 is at least partially removed during formation of the transistor 10 of the conventional DRAM cell. Accordingly, with reference to FIGS. 1 and 11, the word line caps 20 are etched such that the sloped surface 13 extends to and intersects with the substantially horizontal surface 15 at the transition surface 17 (e.g., corner) that projects toward (e.g., into) the word line cap 20 and away from the longitudinal axis 31. Accordingly, the digit line contact opening 30 in which the digit line contact 22 (FIG. 1) is formed is substantially U-shaped. Removal of a portion of the word line caps 20 results in an increased surface area of the digit line contact 22, which increases coupling capacitance between the neighboring digit lines. In contrast and as illustrated in FIGS. 9 and 12 and as previously described herein, the word line caps 114 according to embodiments of the disclosure are substantially unetched, resulting in a decreased surface area of the digit line contacts 150, which decreases coupling capacitance between neighboring digit lines. Semiconductor devices (e.g., the semiconductor device 100) of FIGS. 9 and 10 in accordance with embodiments of the disclosure may be used in embodiments of electronic systems of the disclosure. For example, FIG. 13 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 200 includes at least one memory device 202. The at least one memory device 202 may include, for example, memory cells arranged in an array of rows and columns, the memory cells comprising an embodiment of the semiconductor devices 100 previously described with reference to FIGS. 2-10. The electronic system 200 may further include at least one electronic signal processor device 204 (often referred to as a "microprocessor"). The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touchscreen device that can be used both to input information to the electronic system 200 and to output visual information to a user. The one or more input devices 206 and output devices 208 may communicate electrically with at least one of the memory device 202 and the electronic signal processor device 204.

Accordingly, in embodiments of the disclosure, an electronic system comprises an input device, an output device, a processor device operably coupled to the input device and the output device, and a memory device operably coupled to the processor device. The memory device comprises a digit line contact having a perimeter defined by laterally-neighboring word line caps, an insulating material, and a semiconductive material. A substantially horizontal surface, a substantially vertical surface, and a transition surface therebetween of the respective word line caps define a portion of the perimeter of the digit line contact. The transition surface of the word line caps projects toward a longitudinal axis extending centrally through the digit line contact.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device comprising:
    laterally-neighboring word lines having respective word line caps thereon;
    an active region between the laterally-neighboring word lines and word line caps;
    a stack material adjacent the word line caps; and
    a digit line contact between opposing substantially vertical surfaces of the stack material, adjacent to substantially horizontal surfaces of the word line caps, and between opposing substantially vertical surfaces of the word line caps,
    wherein a transition surface between and connecting the substantially horizontal surfaces and the substantially vertical surfaces of the respective word line caps projects toward a longitudinal axis extending centrally through the digit line contact.

2. The semiconductor device of claim 1, wherein a peripheral surface of the digit line contact is complementary in shape to the substantially horizontal surfaces of the word line caps, the opposing substantially vertical surfaces of the word line caps, and the transition surface therebetween such that the peripheral surface of the digit line contact is indented toward the longitudinal axis.

3. The semiconductor device of claim 1, wherein the digit line contact is adjacent to the substantially horizontal surfaces, the substantially vertical surfaces, and the transition surface of the respective word line caps.

4. The semiconductor device of claim 1, wherein the digit line contact tapers in width as the digit line contact extends axially along the longitudinal axis.

5. The semiconductor device of claim 1, further comprising a digit line adjacent the stack material and the digit line contact.

6. The semiconductor device of claim 1, wherein a barrier material intervenes between the digit line contact and respective substantially vertical surfaces of the stack material.

7. The semiconductor device of claim 6, wherein a substantially horizontal surface of the digit line contact is coplanar with the substantially horizontal surface of the stack material.

8. The semiconductor device of claim 1, wherein the stack material comprises an insulating material and a semiconductive material.

9. The semiconductor device of claim 8, wherein the digit line contact comprises a horizontally elongated portion extending between opposing substantially vertical surfaces of the insulating material and opposing substantially vertical surfaces of a conductive material and a vertically elongated portion extending between opposing substantially vertical surfaces of the word line caps.

10. An electronic system comprising:
    an input device;
    an output device;
    a processor device operably coupled to the input device and the output device; and
    a memory device operably coupled to the processor device and comprising:
        a digit line contact having a perimeter defined by laterally-neighboring word line caps, an insulating material, and a semiconductive material,
        wherein a substantially horizontal surface, a substantially vertical surface, and a transition surface therebetween of the respective word line caps defines a portion of the perimeter of the digit line contact, wherein the transition surface of the word line caps projects toward a longitudinal axis extending centrally through the digit line contact.

11. The electronic system of claim 10, wherein:
    the digit line contact comprises an upper portion and a lower portion;
    the upper portion of the digit line contact extends between opposing substantially vertical surfaces of the semiconductive material and between opposing substantially vertical surfaces of the word line caps;
    the lower portion of the digit line contact extends between opposing substantially vertical surfaces of the laterally-neighboring word line caps; and
    the upper portion having a greater lateral dimension than the lower portion.

12. The electronic system of claim 10, wherein the memory device further comprises a digit line adjacent to the digit line contact.

\* \* \* \* \*

UNITED STATES PATENT AND TRADEMARK OFFICE
CERTIFICATE OF CORRECTION

PATENT NO. : 10,770,466 B2  
APPLICATION NO. : 16/258296  
DATED : September 8, 2020  
INVENTOR(S) : Naoyoshi Kobayashi, Osamu Fujita and Katsumi Koge Page 1 of 1

It is certified that error appears in the above-identified patent and that said Letters Patent is hereby corrected as shown below:

In the Specification  
Column 2, Line 53, change "formed adjacent longitudinally" to --formed adjacent (e.g., longitudinally--

Signed and Sealed this  
Twenty-second Day of December, 2020

Andrei Iancu  
*Director of the United States Patent and Trademark Office*